US005492867A

United States Patent [19]

Kotvas et al.

[11] Patent Number: 5,492,867

[45] Date of Patent: Feb. 20, 1996

[54] METHOD FOR MANUFACTURING A MINIATURIZED SOLID STATE MASS SPECTROGRAPH

[75] Inventors: Joseph C. Kotvas, Monroeville; Timothy T. Braggins; Robert M. Young, both of Pittsburgh; Carl B. Freidhoff, Murrysville, all of Pa.

[73] Assignee: Westinghouse Elect. Corp., Pittsburgh, Pa.

[21] Appl. No.: 320,619

[22] Filed: Oct. 7, 1994

Related U.S. Application Data

[63] Continuation-in-part of Ser. No. 124,873, Sep. 22, 1993, Pat. No. 5,386,115.

[51] Int. Cl.[6] .................. H01L 21/465

[52] U.S. Cl. .................. 437/228; 437/927; 156/626.1; 156/644.1

[58] Field of Search .................. 437/927, 228, 437/250; 156/644.1, 626.1; 73/31.06

[56] References Cited

U.S. PATENT DOCUMENTS

| | | | |
|---|---|---|---|
| 4,938,742 | 7/1990 | Smits | 604/67 |
| 5,003,812 | 4/1991 | Yagawara et al. | 73/31.06 |
| 5,141,460 | 8/1992 | Jaskie et al. | 445/24 |
| 5,209,119 | 5/1993 | Polla et al. | 73/723 |
| 5,354,714 | 10/1994 | Boysel | 437/209 |
| 5,427,975 | 6/1995 | Sparks et al. | 437/79 |

OTHER PUBLICATIONS

W. J. Spencer, "An Electronically Controlled Piezoelectric Insulin Pump and Valves", IEEE Trans. Sonics and Ultrasonics vol. SU–25, No. 3, (1978), pp. 153–156.

H. T. G. VanLintel et al., "A Piezoelectric Micropump Based On Micromachining Of Silicon", 15 Sensors and Actuators (1988), pp. 153–167.

J. G. Smits, "Piezoelectric Micropump With Three Valves Working Peristaltically", A21 Sensors and Actuators (1990), pp. 203–206.

J. W. Judy et al., "Surface–Machined Micromechanical Membrane Pump", Proceedings of IEEE Micro Electro Mechanical Systems (Nara. Japan), (1991) (page numbers not available).

P. Schiller et al., "Design and Process Considerations For Ferroelectric Film–Based Piezoelectric Pressure Sensors", 4th International Symposium On Integrated Ferroelectrics (1992) (page numbers not available).

P. Schiller et al., "Integrated Piezoelectric Microactuators Based on PZT Thin Films", 7th International Conference On Solid State Sensors And Actuators, (1993), pp. 154–157.

G. G. P. vanGorkom, "Back–biased Junction Cold Cathodes: History And State Of The Art", Proceedigs of the 2nd Int. Conf. On Vacuum Microelectronics, (1989), pp. 41—52.

F. Hochberg et al., "A Thin–Film Integrated INcandescent Display", RF–20(11) IEEE Transactions on Electron Devices (1973), pp. 1002–1005.

(List continued on next page.)

*Primary Examiner*—Mary Wilczewski
*Assistant Examiner*—H. Jey Tsai
*Attorney, Agent, or Firm*—Philip A. Florenzo

[57] ABSTRACT

A method for forming a solid state mass spectrograph for analyzing a sample gas is provided in which a plurality of cavities are formed in a substrate, preferably, a semiconductor. Each of these cavities forms a chamber into which a different component of the mass spectrograph is provided. A plurality of orifices are formed between each of the cavities, forming an interconnecting passageway between each of the chambers. A dielectric layer is provided inside the cavities to serve as a separator between the substrate and electrodes to be later deposited in the cavity. An ionizer is provided in one of the cavities and an ion detector is provided in another of the cavities. The formed substrate is provided in a circuit board which contains interfacing and controlling electronics for the mass spectrograph. Preferably, the substrate is formed in two halves and the chambers are formed in a corresponding arrangement in each of the substrate halves. The substrate halves are then bonded together after the components are provided therein.

18 Claims, 5 Drawing Sheets

OTHER PUBLICATIONS

C. H. Mastrangelo et al., "Electrical And Optical Characteristics Of Vacuum Sealed Polysilicon Microlamps", 39(6) IEEE Transactions On Electron Devices, (1992), pp. 1363–1375.

S. Hoshinouchi et al., "Fabrication Of A Fine Heating Element For Microelectronics", Proceedings Of Tbe 2nd Int. Conf. On Vacuum Microelectronics, (1989), pp. 13–16.

D. C. Perng et al., "Micromachined Thermionic Emitters", 2 J. Micromech. Microeng. (1992), pp. 25–30.

R. V. Bellau et al., "Activation Of A Multi–emitter Silicon Carbide p–n Junction Cold Cathode", 4 J. Phys. D: Appl. Phys. (1971), pp. 2022–2030.

C. A. Spindt et al., "Field–Emitter Arrays For Vacuum Microelectronics", 38(10) IEEE Transactions on Electron Devices (1991), pp. 2355–2363.

J. J. Hickman et al., "Surface Composition of Si–TaSi, Eutectic Cathodes And Its Effects On Vacuum Field Emission" 61(21) Appl. Phys. Lett. (1992), pp. 2518–2520.

C. C. Curtis et al., "Spacecraft Mass Spectrometer Ion Source Employing Field Emission Cathodes", 57(5) Rev. Sci. Instrum. (1986), pp. 989–990.

T. N. Criscimagna et al., "AC Plasma Displays", Display Devices (1980), pp. 91–150.

J. Smith "Experimental Storage Display Panels Using DC Gas Discharges Without Resistors", ED–33(9) IEEE Transactions On Electron Devices (1975), pp. 642–649.

J. Mohr et al., "Microactuators Fabricated By The LIGA Process", 2 J. Micromech. Microeng. (1992), pp. 234–238.

F. C. M. VanDePol et al., "A Thermopneumatic Micropump Based On Micro–engineering Techniques", A21–A23 Sensors and Actuators (1990), pp. 198–202.

F. C. M. VanDePol et al., "A Thermopneumatic Actuation Principle For A Microminiature PUmp And Other Micromechanical Devices", 17 Sensors and Actuators (1989), pp. 139–143.

D. Stoeckel, "Status And Trends In Shape Memory Technology", 3rd Int. Conf. On New Actuators (Bremen, Germany) (1992), pp. 79–84.

H. H. Bauer et al., Instrumental Analysis, Chapter 16, pp. 443–459 (1978).

FIG. 3a
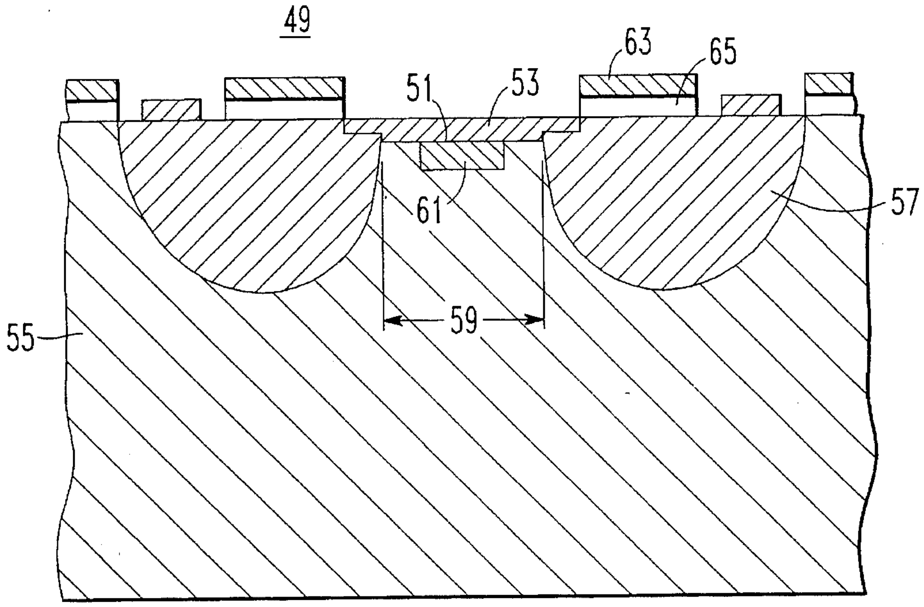
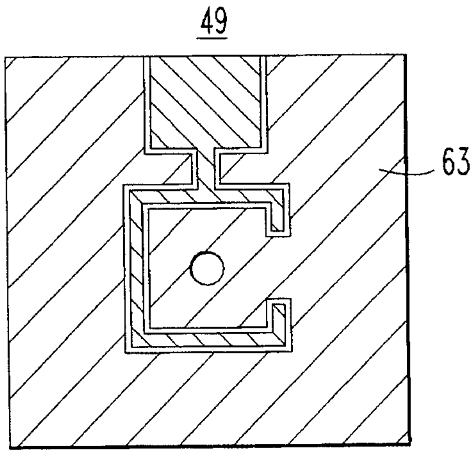
FIG. 3b

FIG. 4
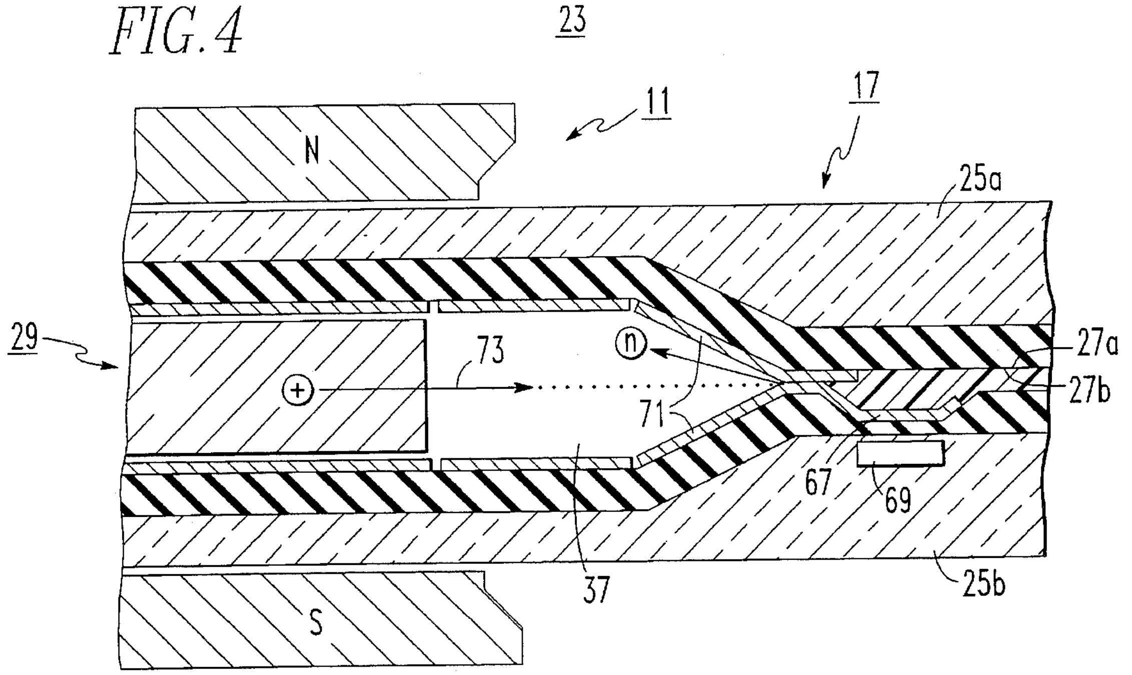
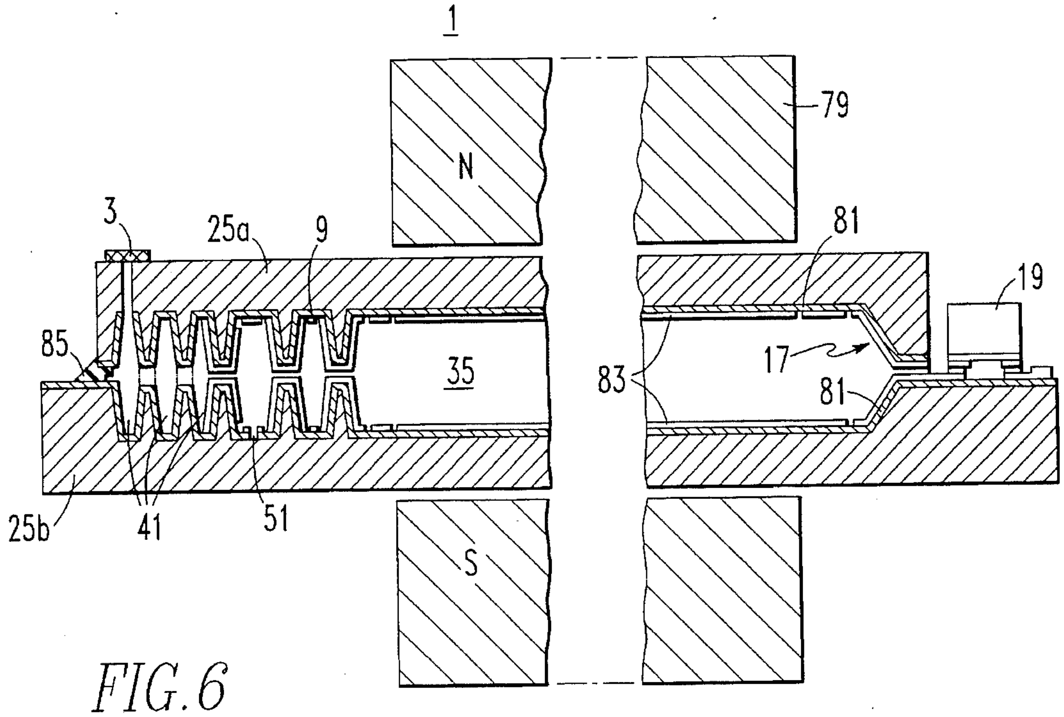
FIG. 6

METHOD FOR MANUFACTURING A MINIATURIZED SOLID STATE MASS SPECTROGRAPH

GOVERNMENT CONTRACT

The government of the United States of America has rights in this invention pursuant to Contract No. 92-F-141500-000, awarded by the United States Department of Defense, Defense Advanced Research Projects Agency.

CONTINUING APPLICATION

This application is a continuation-in-part of application Ser. No. 08/124,873, filed Sep. 22, 1993, now U.S. Pat. No. 5,386,115.

BACKGROUND OF THE INVENTION

1. Field of the Invention

This invention relates to a gas-detection sensor and more particularly to a solid state mass spectrograph which is micro-machined on a semiconductor substrate, and, even more particularly, to a method for manufacturing such a solid state mass spectrograph.

2. Description of the Prior Art

Various devices are currently available for determining the quantity and type of molecules present in a gas sample. One such device is the mass-spectrometer.

Mass-spectrometers determine the quantity and type of molecules present in a gas sample by measuring their masses and intensity of ion signals. This is accomplished by ionizing a small sample and then using electric and/or magnetic fields to find a charge-to-mass ratio of the ion. Current mass-spectrometers are bulky, bench-top sized instruments. These mass-spectrometers are heavy (100 pounds) and expensive. Their big advantage is that they can be used for any species.

Another device used to determine the quantity and type of molecules present in a gas sample is a chemical sensor. These can be purchased for a low cost, but these sensors must be calibrated to work in a specific environment and are sensitive to a limited number of chemicals. Therefore, multiple sensors are needed in complex environments.

A need exists for a low-cost gas detection sensor that will work in any environment. U.S. patent application Ser. No. 08/124,873, filed Sep. 22, 1993, hereby incorporated by reference, discloses a solid state mass-spectrograph which can be implemented on a semiconductor substrate. FIG. 1 illustrates a functional diagram of such a mass-spectrograph 1. This mass-spectrograph 1 is capable of simultaneously detecting a plurality of constituents in a sample gas. This sample gas enters the spectrograph 1 through dust filter 3 which keeps particulate from clogging the gas sampling path. This sample gas then moves through a sample orifice 5 to a gas ionizer 7 where it is ionized by electron bombardment, energetic particles from nuclear decays, or in a radio frequency induced plasma. Ion optics 9 accelerate and focus the ions through a mass filter 11. The mass filter 11 applies a strong electromagnetic field to the ion beam. Mass filters which utilize primarily magnetic fields appear to be best suited for the miniature mass-spectrograph since the required magnetic field of about 1 Tesla (10,000 gauss) is easily achieved in a compact, permanent magnet design. Ions of the sample gas that are accelerated to the same energy will describe circular paths when exposed in the mass-filter 11 to a homogenous magnetic field perpendicular to the ion's direction of travel. The radius of the arc of the path is dependent upon the ion's mass-to-charge ratio. The mass-filter 11 is preferably a Wien filter in which crossed electrostatic and magnetic fields produce a constant velocity-filtered ion beam 13 in which the ions are disbursed according to their mass/charge ratio in a dispersion plane which is in the plane of FIG. 1.

A vacuum pump 15 creates a vacuum in the mass-filter 11 to provide a collision-free environment for the ions. This vacuum is needed in order to prevent error in the ion's trajectories due to these collisions.

The mass-filtered ion beam is collected in a ion detector 17. Preferably, the ion detector 17 is a linear array of detector elements which makes possible the simultaneous detection of a plurality of the constituents of the sample gas. A microprocessor 19 analyses the detector output to determine the chemical makeup of the sampled gas using well-known algorithms which relate the velocity of the ions and their mass. The results of the analysis generated by the microprocessor 19 are provided to an output device 21 which can comprise an alarm, a local display, a transmitter and/or data storage. The display can take the form shown at 21 in FIG. 1 in which the constituents of the sample gas are identified by the lines measured in atomic mass units (AMU).

Preferably, mass-spectrograph 1 is implemented in a semiconductor chip 23 as illustrated in FIG. 2. In the preferred spectrograph 1, chip 23 is about 20 mm long, 10 mm wide and 0.8 mm thick. Chip 23 comprises a substrate of semiconductor material formed in two halves 25*a* and 25*b* which are joined along longitudinally extending parting surfaces 27*a* and 27*b*. The two substrate halves 25*a* and 25*b* form at their parting surfaces 27*a* and 27*b* an elongated cavity 29. This cavity 29 has an inlet section 31, a gas ionizing section 33, a mass filter section 35, and a detector section 37. A number of partitions 39 formed in the substrate extend across the cavity 29 forming chambers 41. These chambers 41 are interconnected by aligned apertures 43 in the partitions 39 in the half 25*a* which define the path of the gas through the cavity 29. Vacuum pump 15 is connected to each of the chambers 41 through lateral passages 45 formed in the confronting surfaces 27*a* and 27*b*. This arrangement provides differential pumping of the chambers 41 and makes it possible to achieve the pressures required in the mass filter and detector sections with a miniature vacuum pump.

The inlet section 31 of the cavity 29 is provided with a dust filter 47 which can be made of porous silicon or sintered metal. The inlet section 31 includes several of the apertured partitions 39 and, therefore, several chambers 41.

The miniaturization of mass spectrograph 1 creates various difficulties in the manufacture of such a device. Accordingly, there is a need for a method for making a miniaturized mass spectrograph.

SUMMARY OF THE INVENTION

A method for forming a solid state mass spectrograph for analyzing a sample gas is provided in which a plurality of cavities are formed in a substrate. Each of these cavities forms a chamber into which a different component of the mass spectrograph is provided. A plurality of orifices are formed between each of the cavities, forming an interconnecting passageway between each of the chambers. A dielectric layer is provided inside the cavities to serve as a separator between the substrate and electrodes to be later deposited in the cavity. An ionizer is provided in one of the cavities and an ion detector is provided in another of the cavities. The formed substrate is provided in or connected to a circuit board which contains interfacing and controlling electronics for the mass spectrograph. Preferably, the substrate is formed in two halves and the chambers are formed in a corresponding arrangement in each of the substrate halves. The substrate halves are then bonded together after the components are provided therein.

BRIEF DESCRIPTION OF THE DRAWINGS

A full understanding of the invention can be gained from the following description of the preferred embodiments when read in conjunction with the accompanying drawings in which:

FIGS. 3*a* and 3*b* are schematic side and top views of an electron emitter manufactured in accordance with the present invention.

FIG. 4 is a longitudinal fractional section through a portion of the mass spectrograph of FIG. 2.

FIG. 6 is a schematic cross-sectional view of the mass spectrograph of FIG. 2.

DETAILED DESCRIPTION OF THE PREFERRED EMBODIMENTS

The key components of mass spectrograph 1 have been successfully miniaturized and fabricated in silicon through the combination of microelectronic device technology and micromachining. The dramatic size and weight reductions which result from this development enable a hand held chemical sensor to be fabricated with the full functionality of a laboratory mass spectrometer.

Figure 1:
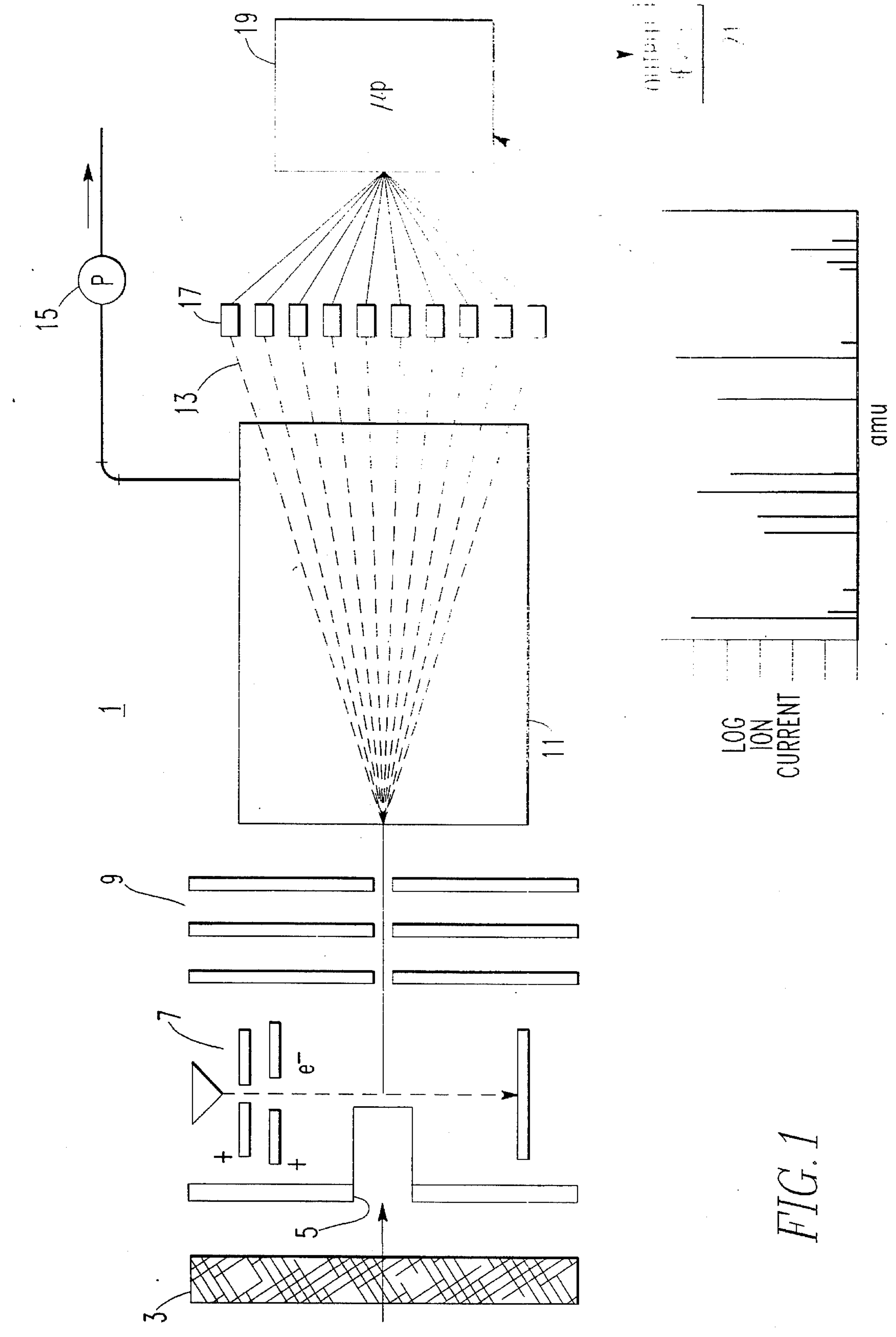
FIG. 1 is a functional diagram of a solid state mass-spectrograph manufactured in accordance with the invention.
Figure 2:
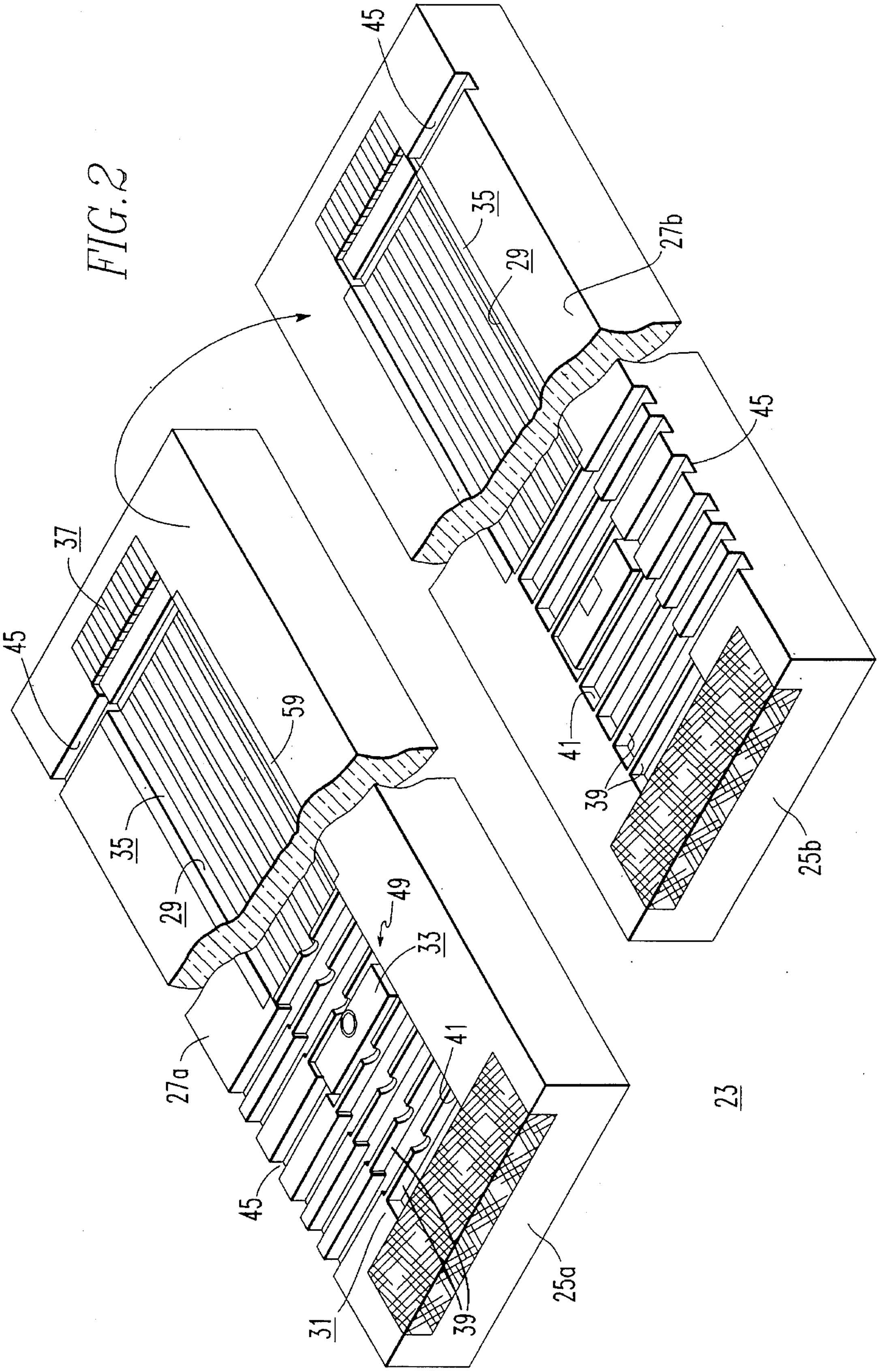
FIG. 2 is an isometric view of the two halves of the mass-spectrograph manufactured in accordance with the invention shown rotated open to reveal the internal structure.

The preferred manufacturing method utilizes bi-lithic integration wherein the components of mass spectrograph 1 are fabricated on two separate silicon wafers, shown in FIG. 2 at 25*a* and 25*b*, which are bonded together to form the complete device. Alternative techniques for incorporating the key silicon microelectronic components into structures fabricated using modern electronic packaging techniques and materials, e.g. LTCC, FOTOFORM glass, and LIGA, can also be used.

The essential semiconductor components of mass spectrograph 1 are the electron emitter 49 for the ionizer 7 and the ion detector array 17. The other components utilize thin film insulators and conductor electrode patterns which can be formed on other materials as well as silicon.

FIGS. 3*a* and 3*b* show the electron emitter 49 having a shallow p-n junction 51 formed by an n++ shallow implant 53 provided on a p+ substrate 55. An n+ diffusion region 57 is provided in substrate 55. An opening 59 provided in said diffusion region 57 into which an optional implant formed of p+ boron and a n++ implant of, for example, antimony are placed. Electron emitter 49 emits electrons from its surface during breakdown in reverse bias. The emitted electrons are accelerated away from the silicon surface by a suitably biased gate 63, mounted on gate insulator 65, and a collector electrode provided on the top half of the ionizer chamber.

FIG. 4 shows the detector array 17 having MOS capacitors 67 which are read by a MOS switch array 69 or a charge coupled device 69. The detector array 17 is connected to an array of Faraday cups formed from a pair of Faraday cup electrodes 71 which collect the ion charge 73.

The interior of the miniature mass spectrograph 1 showing the bi-lithic fabrication is shown in FIG. 2. Here the three dimensional geometry of the various parts of the mass spectrograph 1 are shown together with the location of the ionizer 7 and detector array 17. Preferably, the mass spectrograph 1 is fabricated from silicon. Alternatively, a hybrid approach in which the ionizer 7 and detector array 17 are mounted into a structure which is fabricated from another material containing the other non-electronic components of the device can be used.

Figure 5A:
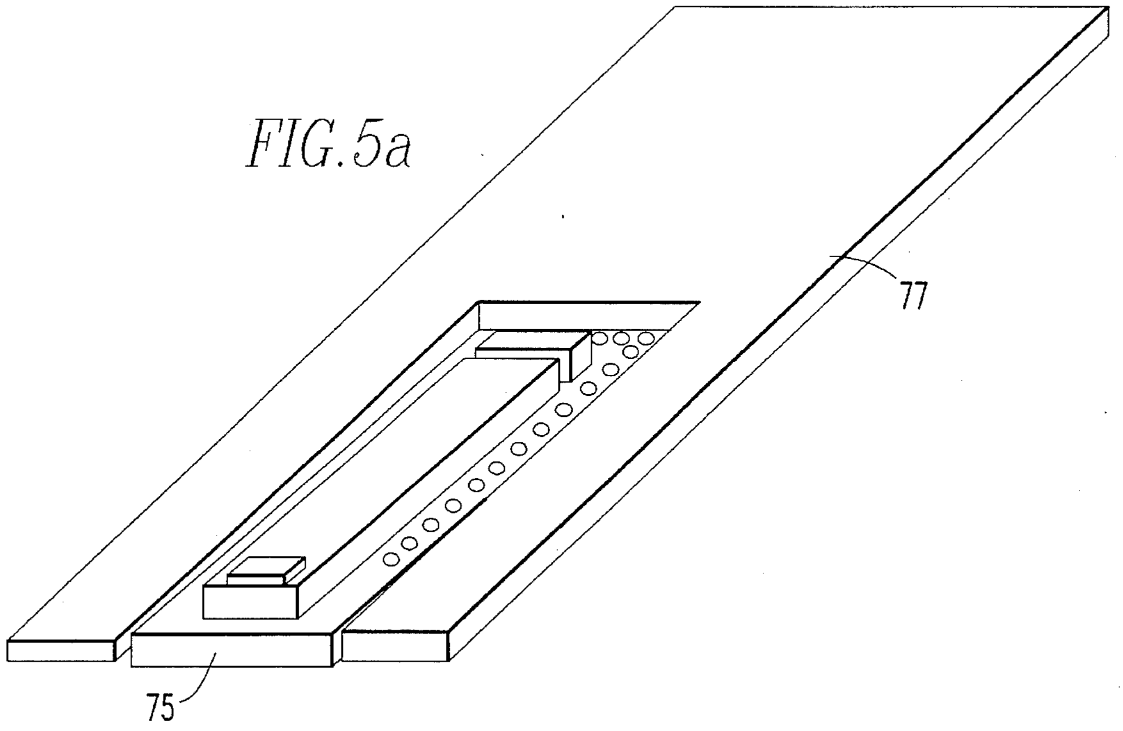
FIGS. 5*a* and 5*b* are schematic illustrations of the integration of the mass spectrograph of the present invention with a circuit board and with a permanent magnet.
Figure 5B:
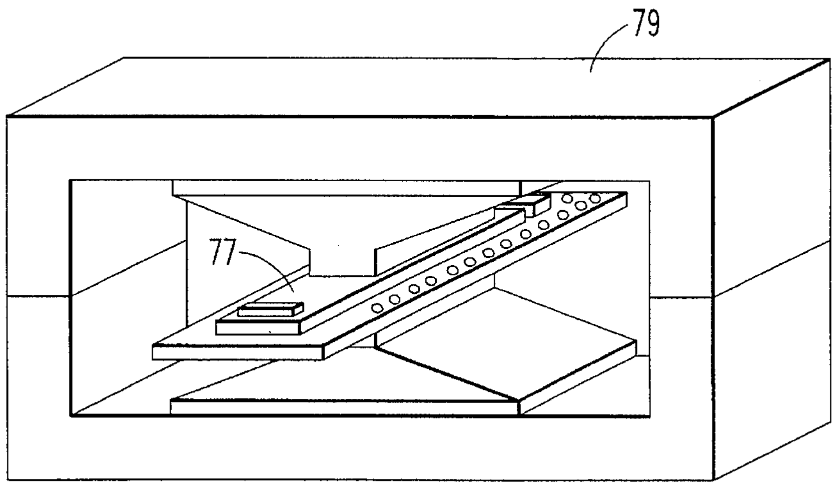

As shown in FIG. 5*a*, the top 25*a* and bottom 25*b* parts of the bi-lithic structure 75 are bonded together and mounted with a circuit board 77 containing the control and interface electronics. This board 77 is then inserted into the permanent bias magnet 79 as shown in FIG. 5*b*. The electronics circuits can also be monolithically integrated with the silicon mass spectrograph structure or can be connected in a hybrid manner with either a hybrid mass-spectrograph or all silicon mass-spectrograph structure.

A cross-section of the all-silicon mass spectrograph 1 is shown in FIG. 6. The top 25*a* and bottom 25*b* silicon pieces are preferably bonded by indium bumps and/or epoxy, which is not shown. The first step in the fabrication of the all-silicon mass spectrograph 1 is the etching of alignment marks in the silicon substrate 25. This assures proper alignment of the etched geometries with the cubic structure of the silicon substrate 25. Once the alignment marks are etched, 40 μm deep chambers 41 are etched in each half 25*a* and 25*b* of the silicon substrate 25. These chambers are etched using an anisotropic etchant such as a potassium hydroxide etching agent or ethylene diamine pyrocatechol (EDP). After the chambers are formed, the orifices between the chambers are formed by etching 10 μm deep features. These orifices are also etched using the anisotropic etching agent.

Once all the major etching is completed, an oxide growth and subsequent etching is performed to round out any sharp edges to assist in the metallization process. Another oxide growth forms dielectric 81 which separates the substrate halves 25*a* and 25*b* from the electrodes 83. An n+ diffusion layer 57 as described above and shown in FIGS. 3*a* and 3*b* is diffused in the substrate 25 to define the ionizer 7. The ionizer gate dielectric is then formed by depositing a layer of dielectric, such as nitride or oxide. An antimony implant is then provided to define the ionizer emitting junction. The optional boron p+ layer 61 can be implanted to better define the shallow p-n junction 51.

Once the ionizer is formed, the ionizer and interconnect can be metallized by depositing a 500 Angstrom layer of chromium followed by depositing a 5000 Angstrom layer of gold. Ionizer passivation is accomplished by depositing a 100 Angstrom layer of gold or other suitable material.

A 5 μm layer of indium can be evaporated on substrate halves 25*a* and 25*b* to form the indium bumps. The substrate halves 25*a* and 25*b* can then be bonded and encapsulated in a hermetic seal 85.

The processes utilized are found in any microelectronic fabrication facility, except for the spray resist application necessary to uniformly coat the non planar geometry, and the photolithographic techniques used to define electron emitter and electrode structures at the bottom of 40 μm chambers.

The structures shown in FIG. 2, except for the ionizer 7 and ion detector 17, can be fabricated by a variety of other means with the ionizer 7 and ion detector 17 inserted in a hybrid manner. Available techniques for this fabrication include mechanical approaches which form metallic or ceramic structures. The minimum feature sizes for mechanically formed geometries is around 25 μm (0.001") which is only a factor of two larger than the 10 μm width of the ion optics aperture used in the all-silicon device. Thus it is feasible to fabricate a hybrid mass-spectrograph which is perhaps a few times larger than the all-silicon spectrograph 1, but is still many times smaller than a conventional laboratory mass spectrograph. Spark erosion or EDM techniques can be utilized to achieve the 25 μm feature sizes at reasonable cost in metals. Dielectric insulating layers are required to isolate the electrodes in the ionizer, mass filter and Faraday cup areas from the metal.

Fabrication of the mass spectrograph structure from dielectrics such as plastic or glass is attractive since a number of insulating layers can be eliminated. Because silicon is a low resistivity semiconductor, several dielectric layers are used in the all-silicon mass spectrograph to prevent grounding of the electrodes. LIGA can be used to form a mold for a plastic to serve as the dielectric with the required mechanical and vacuum properties. Alternatively, a UV sensitive glass such as FOTOFORM brand glass manufactured by Corning, Inc can also be used as the dielectric.

LIGA and quasi-LIGA processes have been developed to produce very high aspect ratio (>100:1) structures of micrometers width in photoresist or other plastic materials such as Plexiglas by photolithographic techniques using synchrotron radiation or short wave length UV. This is presently an expensive process, but once the precise mold is made many structures can be fabricated at low cost. Electrode and interconnect metallization can be defined by photolithography as in the all-silicon case.

UV sensitive glasses are shaped using photolithographic techniques and can achieve feature sizes down to 25 μm with masking, UV exposure, and etching techniques similar to those used in semiconductor processing.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims in any and all equivalents thereof.

We claim:

1. A method for forming a solid state mass spectrograph for analyzing a sample gas comprising the steps of:

a) forming a plurality of cavities in a semiconductor substrate, each of said cavities forming a chamber;

b) forming a plurality of orifices between each of said cavities forming an interconnecting passageway between each of said cavities;

c) forming a dielectric layer inside at least one of said cavities;

d) forming an ionizer in at least one of said cavities; and e) providing an ion detector in at least one of said cavities.

2. The method of claim 1 further comprising the step of providing said substrate in a circuit board, said circuit board containing interface electronics for interfacing and controlling said ionizer and said ion detector.

3. The method of claim 2 further comprising the step of providing said circuit board inside a permanent magnet.

4. The method of claim 1 wherein said substrate comprises a pair of substrate halves and a plurality of corresponding cavities and a plurality of corresponding orifices are provided in each of said halves.

5. The method of claim 4 further comprising the step of bonding each of said substrate halves after said ionizer and said ion detector are provided in said substrate.

6. The method of claim 1 wherein said plurality of cavities and said plurality of orifices are formed in said substrate by etching.

7. The method of claim 6 wherein said substrate is formed from silicon and an anisotropic etchant is used as an agent for said etching.

8. The method of claim 7 wherein said anisotropic etchant is one of potassium hydroxide and ethylene diamine pyrocatechol.

9. The method of claim 1 further comprising the initial step of etching alignment marks into said substrate.

10. The method of claim 1 wherein said ionizer is formed by:

a) diffusing an n+ layer in one of said plurality of cavities;

b) implanting a layer of antimony to define an emitting junction of said ionizer; and c) depositing a dielectric layer to form an ionizer gate dielectric.

11. The method of claim 10 comprising the further step of:

d) implanting a boron p+ layer to define a shallow p-n junction.

12. The method of claim 10 further comprising the steps of: e) metallizing said ionizer by depositing a layer of chromium followed by a layer of gold; and f) passivating said ionizer by depositing a layer of gold.

13. A method for forming a solid state mass spectrograph for analyzing a sample gas comprising the steps of:

a) forming a plurality of cavities in a substrate, each of said cavities forming a chamber;

b) forming a plurality of orifices between each of said cavities forming an interconnecting passageway between each of said cavities;

c) forming a dielectric layer inside at least one of said cavities;

d) forming an ionizer in at least one of said cavities; and e) providing an ion detector means in at least one of said cavities.

14. The method of claim 13 further comprising the step of providing said substrate in a circuit board, said circuit board containing interface electronics for interfacing and controlling said ionizer and said ion detector.

15. The method of claim 14 further comprising the step of providing said circuit board inside a permanent magnet.

16. The method of claim 13 wherein said ionizer is formed by:

a) diffusing an n+ layer in one of said plurality of cavities;

b) implanting a layer of antimony to define an emitting junction of said ionizer; and c) depositing a dielectric layer to form an ionizer gate dielectric.

17. The method of claim 16 comprising the further step of:

d) implanting a boron p+ layer to define a shallow p-n junction.

18. The method of claim 16 further comprising the steps of:

e) metallizing said ionizer by depositing a layer of chromium followed by a layer of gold; and f) passivating said ionizer by depositing a layer of gold.

* * * * *